United States Patent
Cheng et al.

(10) Patent No.: US 11,876,514 B2
(45) Date of Patent: Jan. 16, 2024

(54) OPTOCOUPLER CIRCUIT WITH LEVEL SHIFTER

(71) Applicant: NXP USA, Inc., Austin, TX (US)

(72) Inventors: YangTao Cheng, Shanghai (CN); Kai Zhu, Shanghai (CN)

(73) Assignee: NXP USA, Inc, Austin, TX (US)

( * ) Notice: Subject to any disclaimer, the term of this patent is extended or adjusted under 35 U.S.C. 154(b) by 98 days.

(21) Appl. No.: 17/658,395

(22) Filed: Apr. 7, 2022

(65) Prior Publication Data

US 2022/0352892 A1 Nov. 3, 2022

(30) Foreign Application Priority Data

Apr. 29, 2021 (CN) .......................... 202110477708.6

(51) Int. Cl.
*H03K 19/0175* (2006.01)
*H04L 25/02* (2006.01)

(52) U.S. Cl.
CPC ............... *H03K 19/017509* (2013.01); *H03K 19/01759* (2013.01); *H04L 25/0282* (2013.01)

(58) Field of Classification Search
CPC ..... H03K 19/017509; H03K 19/01759; H03K 19/14; H04L 25/0282
USPC ....................................................... 250/551
See application file for complete search history.

(56) References Cited

U.S. PATENT DOCUMENTS

| | | |
|---|---|---|
| 5,514,875 A | 5/1996 | Krause |
| 8,803,117 B2 | 8/2014 | Wallis et al. |
| 2005/0122154 A1* | 6/2005 | Lee .................. H03K 19/01759 327/333 |
| 2018/0350351 A1 | 12/2018 | Kopys et al. |

FOREIGN PATENT DOCUMENTS

| | | |
|---|---|---|
| CN | 109447241 A | 3/2019 |
| CN | 110516801 A | 11/2019 |
| CN | 108446761 B | 7/2021 |
| EP | 1198909 B1 | 9/2003 |

* cited by examiner

*Primary Examiner* — Thanh Luu

(57) ABSTRACT

In an optocoupler circuit, a first direction path, which transmits signals from a first to a second terminal, includes a first level shifter, a second level shifter, and a first optocoupler. The first level shifter receives a first input signal at the first terminal, and shifts a voltage level of the first input signal to a first shifted voltage level with respect to a first ground level in a first power domain, to provide a first shifted signal. The first optocoupler receives the first shifted signal, and generates a first optocoupler signal in response to the first shifted signal. The second level shifter receives the first optocoupler signal, and shifts a voltage level of the first optocoupler signal to a second shifted voltage level with respect to a second ground level in a second power domain, to provide a second shifted signal at the second terminal.

17 Claims, 2 Drawing Sheets

OPTOCOUPLER CIRCUIT WITH LEVEL SHIFTER

CROSS-REFERENCE TO RELATED APPLICATIONS

This application claims the priority under 35 U.S.C. § 119 of China application no. 202110477708.6, filed on 29 Apr. 2021, the contents of which are incorporated by reference herein.

BACKGROUND

The present disclosure relates to optocoupler circuits with level shifters. More particularly, the present disclosure relates to bidirectional optocoupler circuits with level shifters for bidirectional communication buses.

Communication buses carry communications amongst devices. Isolated communication buses are used for isolating high voltages or conducted radiations of EMI (electromagnetic interference) in applications where there is no common ground. Optocoupler circuits can be implemented in isolated communication buses, to propagate signals from a first domain with a first voltage level into a second domain with a second corresponding voltage level. Optocoupler circuits are driven by signals from the coupled communication buses, and provide signals on another side thereof. Generally, optocoupler circuits operate with given range of voltages, for example voltages around 3.3V, while signals on the communication buses have changing voltages, for example from 1.2V to 3.3V, causing difficulties in operations of the optocoupler circuits. For example, responses of the optocoupler circuits are slowed down. In high-speed communication buses, for example SWD (serial wire debug) buses, in which signal speed can be as high as 10 Mbps, optocoupler circuits with slow responses reduce the signal speed significantly.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, an optocoupler circuit includes a first direction path configured to transmit signals from a first terminal to a second terminal, and a second direction path configured to transmit signals from the second terminal to the first terminal. The first direction path includes a first level shifter, a second level shifter, and a first optocoupler. The first level shifter receives a first input signal at the first terminal, and shifts a voltage level of the first input signal to a first shifted voltage level with respect to a first ground level in a first power domain, to provide a first shifted signal. The first optocoupler receives the first shifted signal, and generates a first optocoupler signal in response to the first shifted signal. The second level shifter receives the first optocoupler signal, and shifts a voltage level of the first optocoupler signal to a second shifted voltage level with respect to a second ground level in a second power domain, to provide a second shifted signal at the second terminal.

According to another embodiment, a bidirectional optocoupler circuit conveys signals between a first terminal and a second terminal. The first terminal is configured with a first voltage level and a first ground level in a first power domain, and the second terminal is configured with a second voltage level and a second ground level in a second power domain. The bidirectional optocoupler circuit includes a first level shifter, an optocoupler, and a second level shifter. The first level shifter is connected to the first terminal, and shifts the first voltage level of an input signal at the first terminal to an intermediate voltage level with respect to the first ground level as a first shifted signal. The optocoupler has an input terminal connected to the first level shifter, and is operable with the intermediate voltage level to transfer the first shifted input signal at the input terminal to an optocoupler signal at an output terminal. The second level shifter is connected to the output terminal of the optocoupler, and shifts the optocoupler signal into the second voltage level with respect to the second ground level as an output signal at the second terminal.

BRIEF DESCRIPTION OF THE DRAWINGS

So that the manner in which the above recited features of the present disclosure can be understood in detail, a more detailed description of the disclosure may be had by reference to embodiments, some of which are illustrated in the appended drawings. The appended drawings illustrate only typical embodiments of the disclosure and should not limit the scope of the disclosure, as the disclosure may have other equally effective embodiments. The drawings are for facilitating an understanding of the disclosure and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
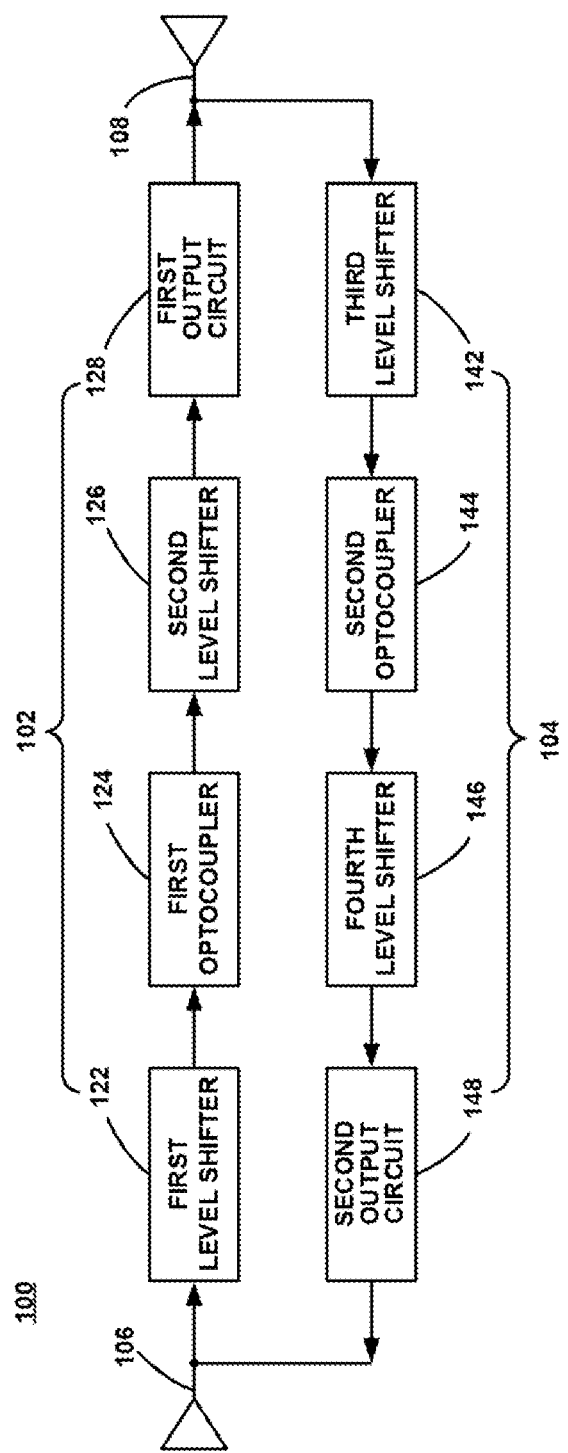
FIG. 1 is a block diagram of a bidirectional optocoupler circuit according to an embodiment.

FIG. 1 depicts a block diagram of a bidirectional optocoupler circuit according to an embodiment. The bidirectional optocoupler circuit 100 includes a first direction path 102 and a second direction path 104 connected between a first terminal 106 and a second terminal 108. As illustrated by the arrows in FIG. 1, the first direction path 102 transmits signals from the first terminal 106 to the second terminal 108, and the second direction path 104 transmits signals from the second terminal 108 to the first terminal 106.

The first direction path 102 includes a first level shifter 122, a first optocoupler 124, a second level shifter 126, and a first output circuit 128 that are series connected between the first terminal 106 and the second terminal 108. Similarly, the second direction path 104 includes a third level shifter 142, a second optocoupler 144, a fourth level shifter 146, and an output circuit 148 that are series connected between the second terminal 108 and the first terminal 106. Generally, the first direction path 102 and the second direction path 104 are configured as similar to or same as each other, and only the first direction path 102 will be described hereinafter. In each of the first direction path 102 and the second direction path 104, the respective optocoupler 124 or 144 provides isolation between the domains on input and output sides thereof. The domains have respective supplies and grounds, and inherently require isolations and signal compatibilities.

The first level shifter 122 receives, from the first terminal 106, a first input signal transmitting from the first terminal 106 to the second terminal 108. The first input signal may have a typical voltage level of 1.2V, 1.8V, or 3.3V relative to a ground level, and the voltage level may vary from time to time. However the first optocoupler 124 has a typical operation voltage level of 5V which is incompatible with the typical voltage level of the first input signal. The first level shifter 122 shifts the voltage level of the first input signal to a first shifted voltage level under which the first optocoupler 124 is operable, for example 5V, to provide a first shifted signal. The first level shifter 122, also can be referred to as a "voltage level translator" or "voltage level transceiver", is a logic level shifter which shifts the voltage level of the input signal into a shifted voltage level with respect to a ground level.

The first optocoupler 124 receives the first shifted signal from the first level shifter 122, and operates to generate a first optocoupler signal as a response. The first optocoupler 124 is a device which has an input terminal and an output terminal, optically couple the first shifted signal into an optocoupler signal to be provided at the output terminal thereof. The first optocoupler 124, also referred to as an opto-isolator, is convenient in propagating value signal components while providing isolation to suppress noises. The first optocoupler 124 according to the present embodiment requires a voltage supply at a level the input signal is already shifted to by the first level shifter 122. Accordingly, in this embodiment, the first optocoupler 124 provides the optocoupler signal as having a typical voltage level of 5V, which on the other hand may be incompatible with the voltage requirements on the second terminal 108.

The second level shifter 126 connects to the first optocoupler 124 and receives the optocoupler signal. The second level shifter 126 converts the voltage level of the optocoupler signal into a second shifted voltage level which is consistent with the requirements on the second terminal side. A second shifted signal is accordingly generated by the second level shifter 126, and provided at the second terminal 108. The second level shifter 126 is also a logic level shifter which is similar to the first level shifter 122 capable of shifting the voltage level of the input signal into a shifted voltage level with respect to the ground level.

The first output circuit 128, which is optional in the optocoupler circuit 100 of the present embodiment, is connected between the second level shifter 126 and the second terminal 108. The first output circuit 128 receives the second shifted signal from an output terminal of the second level shifter 126, and delivers the second shifted signal to the second terminal 108 by setting a default voltage level on the second terminal 108 and suppressing transient voltage levels in the second shifted signal.

Figure 2:
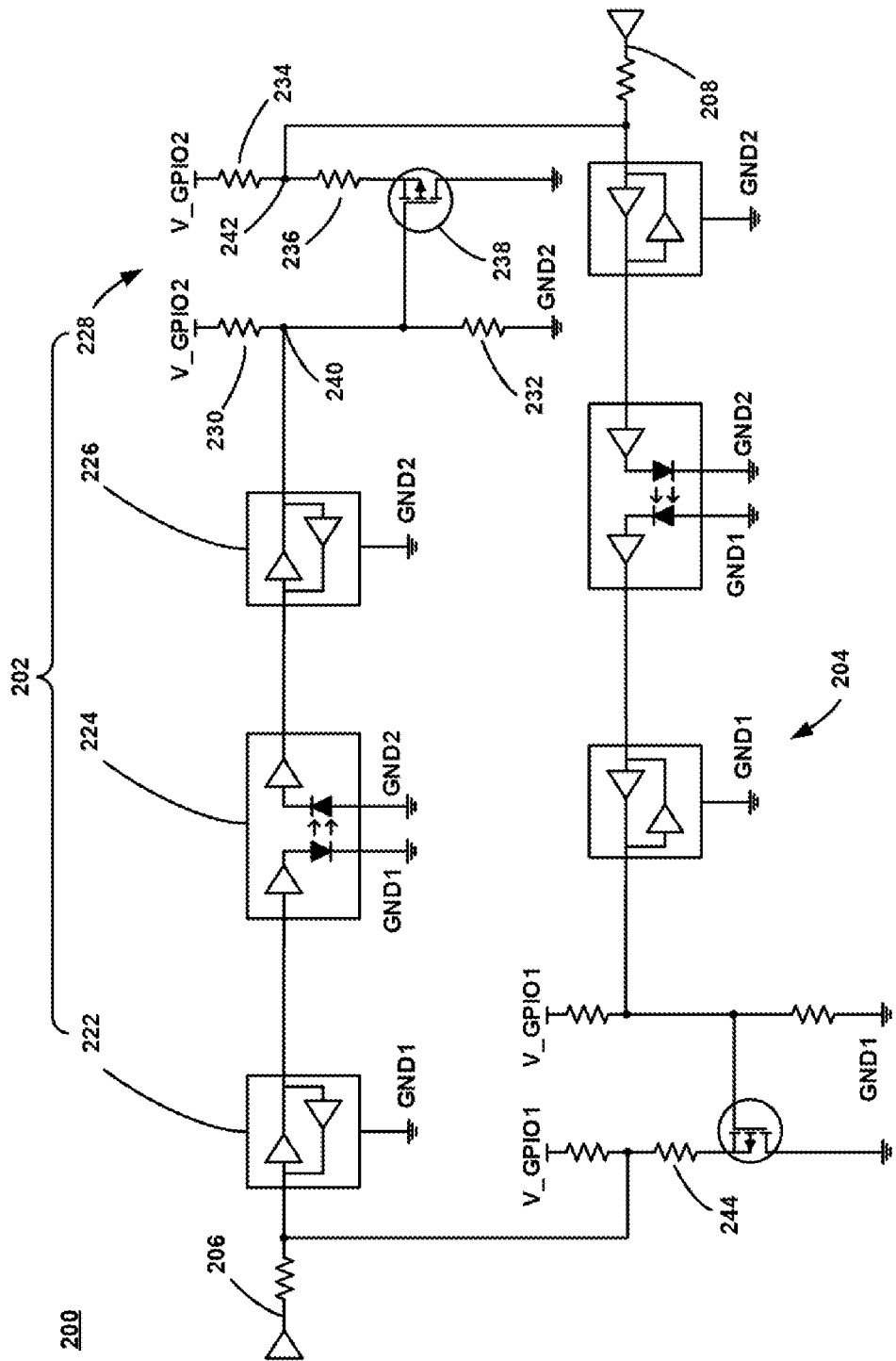
FIG. 2 is a circuit diagram of the bidirectional optocoupler circuit of FIG. 1 according to an embodiment.

FIG. 2 illustrates a circuit diagram of a bidirectional optocoupler circuit according to an embodiment of the disclosure. The bidirectional optocoupler circuit 200 can be an implementation of the bidirectional optocoupler circuit 100 of FIG. 1. According to the embodiment, the bidirectional optocoupler circuit 200 includes a first direction path 202 and a second direction path 204 conveying signals between a first terminal 206 and a second terminal 208. The first direction path 202 and the second direction path 204 generally have the same configurations, and only the first direction path 202 will be described hereinafter.

The first direction path 202 includes a first level shifter 222, an optocoupler 224, a second level shifter 226, and an output circuit 228 that are series connected from the first terminal 206 to the second terminal 208, and operate the same as the first level shifter 122, the first optocoupler 124, the second level shifter 126, and the first output circuit 128 of FIG. 1. Specifically, the first level shifter 222 and the input side of the optocoupler 224 are connected in a first power domain with a first ground level GND1, while the second level shifter 226 and the output side of the optocoupler 224 are connected in a second power domain with a second ground level GND2. In some embodiments the first ground level GND1 and the second ground level GND2 are the same, while in other some embodiments the first ground level GND1 is different from the second ground level GND2. As described above, the first level shifter 222 and the second level shifter 226 are logic level shifters that shift the "high" voltage level of input signals to a different voltage level with respect to respective ground levels. For example, if an input signal into the first level shifter 222 has a voltage level of 1.8V (digital "1") with respect to the first ground level GND1, the first level shifter 222 can be able to shift the voltage level to 5V with respect to the first ground level GND1, with a 3.2V shift. However, if the digital input signal becomes a digital "0" with a voltage level around the first ground level GND1, the first level shifter 222 does not similarly shift this low voltage level digital "0" up to 3.2V, but just keep the low-level digital "0" at low.

The output circuit 228 includes a first resistor 230 and a second resistor 232 that are series connected between a voltage supply having a second terminal voltage level V_GPIO2 and ground having a ground level GND2. As an example, the second terminal voltage level is a default voltage level on the second terminal 208 with respect to the ground level GND2 in the domain of the second terminal 208. The second terminal voltage level can be 1.2V, 1.8V, or 3.3V in the embodiment, as described above. A first node 240 between the first resistor 230 and the second resistor 232 is connected to the output terminal of the second level shifter 226, to receive the second shifted signal from the second level shifter 226.

The output circuit 228 further includes a third resistor 234, a fourth resistor 236, and a transistor 238 that are series connected between the voltage supply having the second terminal voltage level V_GPIO2 and ground having the second ground level GND2. In detail, the third resistor 234 has a first terminal (upper terminal) connected to the voltage supply having the second voltage level V_GPIO2, and a second terminal (lower terminal) connected to the fourth resistor 236. The fourth resistor 236 also has a first terminal (upper terminal) connected to the lower terminal of the third resistor 234, and a second terminal (lower terminal) connected to the transistor 238. The transistor 238 has a gate terminal (control terminal) connected to the first node 240 between the first resistor 230 and the second resistor 232 and also connected to the output terminal of the second level shifter 226, a first current terminal (upper current terminal) connected to the fourth resistor 236, and a second current terminal (lower current terminal) connected to ground GND2. A second node 242 (output node) between the third resistor 234 and the fourth resistor 236 is connected to the second terminal 208.

The first resistor 230 and the second resistor 232 of the output circuit 228 decide a default voltage level on the second terminal 208, for example as a default low voltage level. When an input signal is transmitted from the first terminal 206 to the second terminal 208, the first level shifter 222 shifts the input signal to a desired voltage level in the first power domain with respect to the first ground level GND1 and which is suitable for the optocoupler 224 to operate. The output signal of the optocoupler 224 is shifted by the second level shifter 226 into a voltage level in the second power domain with respect to the second ground level GND2 and which is consistent with the requirements on the second terminal 208. For example, a low voltage level (in digital signal form, a signal "0") with respect to the ground GND1 in the input signal have the second level shifter 226 to provide a low voltage level (digital "0") with respect to the ground GND2, which applies on the gate terminal of the transistor 238 and turns the transistor 238 conductive, and pulls the voltage level on the second terminal 208 low to a digital "0". The low level value "0" on the second terminal 208 provides a feedback to the first terminal 206 through the second direction path 204 in a similar way as operated in the first direction path 202.

The bidirectional optocoupler circuit 200 is further advantageous in suppressing transient voltages in the input signals. As an example, if the input signal on the first terminal 206 undergoes a transient voltage, the voltage level on the first terminal 206 goes to an unwanted high level. On the other hand, due to the delay time introduced by the elements in the paths, the feedback voltage through the second direction path 204 remains low level. In the depicted embodiment, the fourth resistor 236 connected between the third resistor 234 and the transistor 238 have a relatively large resistance, for example hundreds of ohms and configurable according to signal communication speed requirements, to avoid the contradiction. Similarly, the resistor 244 of the second direction path 204 is arranged to have a relatively large resistance. Because the level shifters are suitable for a wide range of voltage levels in inputting and outputting signals, e.g. 1.2V to 5.5V, and the output circuits provide transient voltage suppression, the bidirectional optocoupler circuits 100 and 200 of the embodiments are able to support communication rates as high as more than 1 Mbps to 20 Mbps, and are applicable in a variety of communication protocols, for example in isolated I2C buses, SWD (serial wire debug), 1-wire, etc.

As described above, the in the second direction path 104 of FIG. 1 and the second direction path 204 of FIG. 2, the similar configurations operate the input signal from the second terminal 108 or 208 having the second terminal voltage level V_GPIO2 to be shifted to the voltage level under which the optocoupler 144 is supplied and operable, and in turn shifts the optocoupler signal into the first terminal voltage level V_GPIO1 through the second level shifter 146.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal". Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the disclosure as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. An optocoupler circuit comprising:
    a first direction path configured to transmit signals from a first terminal to a second terminal; and
    a second direction path configured to transmit signals from the second terminal to the first terminal;
    wherein the first direction path comprises:
        a first level shifter configured to receive a first input signal at the first terminal, and shift a voltage level of the first input signal to a first shifted voltage level with respect to a first ground level in a first power domain, to provide a first shifted signal;
        a first optocoupler configured to receive the first shifted signal, and generate a first optocoupler signal in response to the first shifted signal; and
        a second level shifter configured to receive the first optocoupler signal, and shift a voltage level of the first optocoupler signal to a second shifted voltage level with respect to a second ground level in a second power domain, to provide a second shifted signal at the second terminal.

2. The optocoupler circuit of claim 1, wherein an input terminal of the first optocoupler is connected to a power supply having the first shifted voltage level with respect to the first ground level.

3. The optocoupler circuit of claim 1, wherein the first shifted voltage level is 5V with respect to the first ground level.

4. The optocoupler circuit of claim 1, wherein the voltage level of the first optocoupler signal is 5V with respect to the second ground level.

5. The optocoupler circuit of claim 1, wherein the first direction path further comprises a first output circuit connected between the second level shifter and the second terminal, wherein the first output circuit is configured to set a default voltage level on the second terminal.

6. The optocoupler circuit of claim 5, wherein the first output circuit comprises:
    a first resistor and a second resistor series connected between a voltage supply having a second terminal voltage level and a ground having the second ground level in the second power domain, wherein a first node between the first resistor and the second resistor receives the second shifted signal from the second level shifter; and a first transistor having a control terminal connected to the first node between the first resistor and the second resistor, a first current terminal connected to the ground, and a second current terminal connected to the voltage supply having the second terminal voltage level by way of a third resistor and a fourth resistor, wherein a second node between the third resistor and the fourth resistor is connected to the second terminal.

7. The optocoupler circuit of claim 1, wherein the second direction path comprises:

a third level shifter configured to receive a second input signal at the second terminal, and shift a voltage level of the second input signal to a third shifted voltage level with respect to the second ground level in the second power domain, to provide a third shifted signal;

a second optocoupler configured to receive the third shifted signal, and generate a second optocoupler signal in response to the third shifted signal; and a fourth level shifter configured to receive the second optocoupler signal, and shift a voltage level of the second optocoupler signal to a fourth shifted voltage level with respect to the first ground level in the first power domain, to provide a fourth shifted signal at the first terminal.

8. The optocoupler circuit of claim 7, wherein an input terminal of the second optocoupler is connected to a power supply having the third shifted voltage level.

9. The optocoupler circuit of claim 7, wherein the third shifted voltage level is 5V with respect to the second ground level.

10. The optocoupler circuit of claim 7, wherein the voltage level of the second optocoupler signal is 5V with respect to the first ground level.

11. The optocoupler circuit of claim 7, wherein the second direction path further comprises a second output circuit connected between the fourth level shifter and the first terminal, wherein the second output circuit is configured to set a default voltage level on the first terminal.

12. The optocoupler circuit of claim 11, wherein the second output circuit comprises:

a fifth resistor and a sixth resistor series connected between a voltage supply having a first terminal voltage level and a ground having the first ground level in the first power domain, wherein a third node between the fifth resistor and the sixth resistor receives the fourth shifted signal from the fourth level shifter; and a second transistor having a control terminal connected to the third node between the fifth resistor and the sixth resistor, a third current terminal connected to the ground, and a fourth current terminal connected to the voltage supply having the first terminal voltage level by way of a seventh resistor and an eighth resistor, wherein a fourth node between the seventh resistor and the eighth resistor is connected to the first terminal.

13. A bidirectional optocoupler circuit configured to convey signals between a first terminal and a second terminal, wherein the first terminal is configured with a first voltage level and a first ground level in a first power domain, and the second terminal is configured with a second voltage level and a second ground level in a second power domain, wherein the bidirectional optocoupler circuit comprises:

a first level shifter connected to the first terminal, and configured to shift the first voltage level of an input signal at the first terminal to an intermediate voltage level with respect to the first ground level as a first shifted signal;

an optocoupler having an input terminal connected to the first level shifter, and operable with the intermediate voltage level to transfer the first shifted input signal at the input terminal to an optocoupler signal at an output terminal; and a second level shifter connected to the output terminal of the optocoupler, and configured to shift the optocoupler signal into the second voltage level with respect to the second ground level as an output signal at the second terminal.

14. The bidirectional optocoupler circuit of claim 13, wherein the intermediate voltage level is 5V.

15. The bidirectional optocoupler circuit of claim 13, further comprising first and second resistors series connected between a voltage supply having the second voltage level and a ground having the second ground level, configured to provide the second voltage level as a default voltage level on the second terminal, wherein a node between the first resistor and the second resistor is connected to an output terminal of the second level shifter.

16. The bidirectional optocoupler circuit of claim 13, further comprises an output circuit connected between an output terminal of the second level shifter and the second terminal; wherein the output circuit comprises:

a third resistor having a first terminal connected to a voltage supply having the second voltage level and a second terminal connected to an output node;

a fourth resistor having a first terminal and a second terminal, the first terminal of the fourth resistor is connected to the output node; and a transistor having a first current terminal connected to the second terminal of the fourth resistor, a second current terminal connected to a ground having the second ground level, and a control terminal connected to the output terminal of the second level shifter.

17. The bidirectional optocoupler circuit of claim 13, wherein the bidirectional optocoupler circuit comprises a first path configured to transfer signals in a first direction, and a second path configured to transfer signals in a second direction opposite to the first direction; and wherein the first path and the second path each comprises a corresponding first level shifter, optocoupler, and second level shifter.

* * * * *